United States Patent
Choi et al.

[11] Patent Number: 6,139,996
[45] Date of Patent: Oct. 31, 2000

[54] COLOR FILTER SOLUTION FOR A CATHODE RAY TUBE AND METHOD FOR PATTERNING A COLOR FILTER

[75] Inventors: Hong-gyu Choi; Hyun-Jin Kim, both of Kyonggi-do; Ki-Jun Kim, Seoul, all of Rep. of Korea

[73] Assignee: Samsung Display Devices Co., Ltd., Rep. of Korea

[21] Appl. No.: 09/280,132

[22] Filed: Mar. 26, 1999

[30] Foreign Application Priority Data

Nov. 20, 1998 [KR] Rep. of Korea ............... 98-49988

[51] Int. Cl.[7] .............. B05D 5/06; H02J 29/32; C09K 1/00
[52] U.S. Cl. ............ 430/27; 106/287.18; 106/287.2; 427/68; 427/72; 427/512; 427/514; 313/466
[58] Field of Search .................. 430/27; 427/68, 427/72, 512, 514; 313/466; 106/287.18, 287.2

[56] References Cited

U.S. PATENT DOCUMENTS 5,700,609  12/1997  Matsuda et al. ................ 430/27
5,721,089  2/1998  Takao et al. ................ 430/283.1
5,898,263  4/1999  Itou et al. ................ 313/474

*Primary Examiner*—David Brunsman
*Attorney, Agent, or Firm*—Baker & McKenzie

[57] ABSTRACT

A color filter solution for applying on a face glass of a cathode ray tube and a method for patterning a color filter to improve the brightness and contrast characteristics of the color filter. The color filter solution comprises a pigment, an anion surfactant which contains sodium or ammonium ion or citric acid as a dispersion agent, a mixture solvent of a glycol and a pyrrolidone containing methyl or ethyl, a nonionic surfactant and a pure water. A method for patterning a color filter in a cathode ray tube comprises the steps of:

preparing a color filter solution which comprises a pigment, an anion surfactant which contains sodium or ammonium ion or citric acid as a dispersion agent, a mixture solvent of a glycol and a pyrrolidone containing methyl or ethyl, and a nonionic surfactant;

forming a photoresist slurry by adding an alcohol-sodium or ammonium dichromate to the color filter solution ; and coating, exposing and developing the photoresist slurry on a face glass.

6 Claims, No Drawings

COLOR FILTER SOLUTION FOR A CATHODE RAY TUBE AND METHOD FOR PATTERNING A COLOR FILTER

BACKGROUND OF THE INVENTION

1. Field of the Invention

The present invention relates to a color filter to be patterned on a cathode ray tube (CRT) so as to enhance the brightness and contrast characteristics of the CRT, and more particularly, to a suitable color filter solution for a color filter and a method for pattering a color filter therewith.

2. Description of the Prior Art

Typically, a cathode ray tube(CRT) is a device for forming an image by excitation light emission of a phosphor of red, green, and blue of a phosphor screen by landing an electron emitted from an electron gun and accelerated by high voltage on the phosphor.

Various characteristics are required to the phosphor screen of the CRT, but the most important characteristics are brightness and a contrast.

Generally, a dark-tint glass panel with 40–50% transmittance, a semi-tint glass panel with 50–60% transmittance and a clear panel with 80–90% transmittance which are classified in accordance with its light transmittance have been used to improve the contrast in the CRT.

However, there are a wide difference in the light-transmittance among the above panels and more particularly, the contrast and brightness characteristics are appeared contrary to each other. In the dark-tint glass panel, rays of the light incident thereon from the outside thereof are considerably absorbed by the dark-tint glass panel to improve contrast, but rays of the light exited by the phosphor are also absorbed to decrease brightness.

Conversely, in the clear panel, the rays of the light exited by the phosphor are mostly passed through the clear panel thereby to increase the brightness but the rays of the light from the outside are reflected to decrease the contrast.

Accordingly, the contrast and brightness are contrary to each other, so that it is very difficult to increase the both characteristics.

Applying of a pigment to the phosphor to absorb the rays of the light from the outside is also known. That is, a CRT, in which a layer including a opaque pigment of uniformly sized particles is provided between a face glass and phosphor screen, is disclosed. However, a part of the rays of the light exited by the phosphor is absorbed in the pigment, so that the 10–15% decrease of brightness is estimated.

Another type CRT is disclosed to solve the problem that the increasing of the contrast in the CRT carries the decreasing of the brightness. The CRT comprises a glass panel of which the inner side is provided with the patterned color filters of a green, a blue and a red, respectively, so that the rays of the light with the corresponding wavelength are transmitted and the rays of the light with other wavelength are filtered when the exited rays of the light are passed through the filter, thereby cause to improve the brightness, contrast, and color producing capacity in the CRT.

If the above technique is employed in the clear panel with a high transmitance of light, the contrast can be enhanced with the outside rays of the light absorbed in the color filter together with the enhancement of the brightness by the characteristics of the clear panel.

To obtain the above CRT, a black matrix should be deposited on the glass panel and the color filters are patterned correspondingly to the green, blue and red phosphor to be patterned, respectively followed by patterning the corresponding phosphor to be multi-layered.

However, such techniques would cause to decrease the production efficiency because it needs a number of processes that the respective color filters of three kinds have to be patterned by a separate process. Further a rate of loss of a slurry for the color filters is increased and the cost is risen together with a decrease of the yield because of the difficulties of the management of the processes.

Furthermore, in the case of a red filter, $Fe_2O_3$ as a filter material, has a property absorbing the violet ray upon its exposure, and thus the patterning by a normal photoresist method is difficult. Thus, the red filter patterning should be processed with the both photoresist and etching methods, which cause increase the steps together with a pollutant discharge.

On the other hand, some conditions are required to apply color filter slurry on the black matrix. At first, a well-dispersed and stable color filter solution is required which has a good transmission characteristic and has no reactions with a photoresist (e.g., polyvinyl alcohol and sodium dichromate) added therein and with a black matrix upon applying.

In the typical dispersion method of color filter, a pigment of super fine particles, citric acid as a dispersion agent and a glycol solvent have been used.

However, such method provides another problem together with a light transmitrance. That is, when the polyvinyl alcohol is added, the color filter solution is gelatinized thereby causing the black matrix to be contaminated or to be fallen off. The color filter solution is so sensitive to pH. It is stable under pH 5.0 but when the pH becomes lower, the particles in the solution are cohered because the potential of zeta is lowered. It is thus difficult to obtain the desired transmittance characteristic of the color filter and a cloudy screen is obtained.

Accordingly, it has been required to provide a slurry preparing process and an easier red filter patterning process for obtaining a desired transmittance and exposing conditions of a color filter by means of a photoresist techniques with a slurry sensitive to light in the CRT with a color filter.

SUMMARY OF THE INVENTION

The present invention has been made in an effort to solve the above described problems.

It is an objective of the present invention to provide a color filter solution for applying on a face glass of a CRT to enhance the brightness and contrast characteristics of a cathode ray tube.

Another objective of the invention is to provide a method for patterning a color filter on the face glass with the color filter solution.

To achieve the above objectives, the present invention provides color filter solution which comprises a pigment, an anion surfactant which contains sodium or ammonium ions or citric acid as a dispersion agent, a mixture solvent of a glycol and a pyrrolidone containing methyl or ethyl, a nonionic surfactant and a pure water.

Here, as the pigments, conventional pigments may be employed, for example $Fe_2O_3$ as a red pigment, a cobalt oxide of fine sized particles as blue and green pigments.

The red pigment is used about 3–20 wt %, the blue pigment is used about 5–25 wt % and the green pigment is used about 2–15 wt % by weight of the color filter solution, respectively.

As the glycol solvent, methylene glycol, ethylene glycol and propylene glycol may be used. In addition, as the pyrrolidone solvent, N-methyl pyrrolidone, ethyl pyrrolidone and dimethyl pyrrolidone may be used.

As the dispersion agent, the anionic surfactant which contains sodium or ammonium is used, for example naphthalene sodium sulfate, wherein the citric acid or sodium citrate may be added.

As the nonionic surfactant suitable to the present invention, a copolymer of ethylene oxide and propylene oxide may be used.

The solvent is used preferably about 10–20 wt %, the dispersion agent about 1–5 wt % and the nonionic surfactant 0.03–0.5 wt % by weight of the color filter solution respectively.

A color filter pattern is formed on the face glass by steps of preparing the photoresist slurry adding a polyvinyl alcohol and sodium dichromate to the color filter solution and applying the slurry on the face glass followed by exposing and developing steps.

Resultingly, the color filter pattern having good transmittance and exposure characteristics are obtained.

In addition, the slurry application is performed with the coating angle of 130–150° and the rapid rotating at the angle of 60–90° by means of the spin coating technique so that the characteristics are not deteriorated in the followed patterning step.

DETAILED DESCRIPTION OF PREFERRED EMBODIMENT

Preferred examples of the present invention will be described hereinafter.

Embodiment 1 (Color Filter Solution)

3–20 wt % of $Fe_2O_3$ as a red pigment was dissolved in pure water and then stirred. After being stirred, 2 wt % of sodium citrate, a mixture solvent of 13 wt % of ethylene glycol and 3 wt % of N-methyl pyrrolidone, and 0.05 wt % of a copolymer of ethylene oxide and propylene oxide as a nonionic surfactant was added and stirred again.

By the reaction described in the above, a red color filter solution according to the present invention is obtained.

A blue color filter solution is obtained in the same manner as described in the above using 5–25 wt % of $CoOAl_2O_3$ of super sized particles and the green color filter solution is obtained using 2–15 wt % of $TiO_2$-NiO, CoO, ZnO.

A red, blue and green photoresist slurries are prepared by adding 0.5 wt % of polyvinyl alcohol and 0.5 wt % of sodium dichromate to the above red, blue and green color filter solution, respectively. The photoresist slurry is then spin-coated on the face glass with coating angle of 130–150° and the rapid rotating at the angle of 60–90° to obtain the desired color filter pattern.

Embodiment 2

A comparative test is performed with the color filter solution according to the present invention and the two conventional color filter solutions to compare the characteristics.

A conventional sample 1 is prepared by dispersing $Fe_2O_3$ into pure water and a conventional sample 2 is prepared by dispersing $Fe_2O_3$ and sodium citrate into a pure water. The color filter patterns are formed with the photoresist slurry including the polyvinyl alcohol-sodium (or ammonium) dichromate.

TABLE 1

| Characteristics | Sample 1 | Sample 2 | Present invention |
|---|---|---|---|
| Transmittance | 40% | 50% | more than 85% |
| Exposing time | 4 min. | 3–4 min. | less than 60 sec. |

From the results shown in Table 1, it is found that the color filter pattern formed by the color filter solution according to the present invention shows about two times enhancement in the transmittance and decrease of the exposing time compared to those by the conventional color filter solutions whereby the production efficiency can be increased.

Embodiment 3

A comparative tests are performed by spin coating with the color filter solution at different coating angles and rapid rotating angles. The results are shown in Table 2.

In the Table 2, the column A shows the results at the coating angle of 135–145° together with the rapid rotating angle of 130–145°, the column B shows the results at the coating angle of 135–145° together with the rapid rotating angle of 1–30°, the column C shows the results at the coating angle of 135–145° together with the rapid rotating angle of 65–80°, and the column D shows the results at the coating angle of 75–90° together with the rapid rotating angle of 75–90°

TABLE 2

| Characteristics | A | B | C | D |
|---|---|---|---|---|
| Filter Film | Δ | X | ⊙ | Δ |
| Inferiority(Vapor, Spot) | Spots | Thin film | ⊙ | Spots |
| Pattern | Δ | Δ | ⊙ | |

* Indications: ⊙ excellence, ○ good, Δ normal, X inferiority

From the above, the results of the test show that the coating angles and the rapid rotating angles of the color filter solution affect the characteristics of transmission and exposure of the color filter pattern, and the qualities of the face glass.

From the results shown in Table 2, the best characteristics of the color filter is obtained under the process conditions of the coating angles of 130–150° and the rapid rotating angles of 60–90°.

The color filter pattern can be formed by the normal slurry process and not etching process, with the color filter solution according to the present invention characterized by comprising a pigment, a nonionic surfactant, an anion surfactant containing sodium or ammonium ion or citric acid and a mixture solvent of glycol and pyrrolidone which contains methyl and ethyl thereby causing the color filter pattern to have good transmittance and exposing characteristics together with increasing the production efficiency.

Furthermore, according to the present invention, a defective ratio is decreased at least 20% with slurry coat angle of the range between 130° and 150° and rapid rotating angle of the range between 60° and 90° in the process of forming a color filter. Using the color filter solution which contains the red pigment of 3–20 wt %, the blue pigment of 5–25 wt % and the green pigment of 2–15 wt %, respectively, the color filter formed on the face glass has characteristics of transmittance 85% or more than and selective transtmittance characteristics of green 30%, blue 50% and red 70%.

What is claimed is:

1. A color filter solution for a cathode ray tube comprising a pigment, an anion surfactant which contains sodium or ammonium ion or citric acid as a dispersion agent, a mixture solvent of a glycol and a pyrrolidone containing methyl or ethyl, a nonionic surfactant and a pure water.

2. A color filter solution of claim 1 wherein a red pigment is mixed in the range between 3 and 20 wt % by weight of the color filter solution.

3. A color filter solution of claim 1 wherein a blue pigment is mixed in the range between 5 and 25 wt % by weight of the color filter solution.

4. A color filter solution of claim 1 wherein a green pigment is mixed in the range between 2 and 15 wt % by weight of the color filter solution.

5. A method for patterning a color filter in a cathode ray tube, comprising the steps of:

preparing a color filter solution which comprises a pigment, an anion surfactant which contains sodium or ammonium ion or citric acid as a dispersion agent, a mixture solvent of a glycol and a pyrrolidone containing methyl or ethyl, and a nonionic surfactant;

forming a photoresist slurry by adding an alcohol-sodium or ammonium dichromate to the color filter solution; and coating, exposing and developing the photoresist slurry on a face glass.

6. A method of claim 5 wherein said coating step is performed at a coating angle of a range between 130° and 150° and rapid rotating angle of the range between 60° and 90°.

* * * * *